United States Patent [19]
Jiang et al.

[11] Patent Number: 6,021,147
[45] Date of Patent: Feb. 1, 2000

[54] VERTICAL CAVITY SURFACE EMITTING LASER FOR HIGH POWER SINGLE MODE OPERATION AND METHOD OF FABRICATION

[75] Inventors: Wenbin Jiang, Phoenix; Rong-Ting Huang, Gilbert; Michael S. Lebby, Apache Junction, all of Ariz.

[73] Assignee: Motorola, Inc., Schaumburg, Ill.

[21] Appl. No.: 08/963,623

[22] Filed: Nov. 4, 1997

[51] Int. Cl.[7] .................................................. H01S 3/085
[52] U.S. Cl. ................................................ 372/46; 372/96
[58] Field of Search ................................ 372/96, 50, 45, 372/66, 46; 438/39, 41

[56] References Cited

U.S. PATENT DOCUMENTS

| | | | |
|---|---|---|---|
| 5,038,356 | 8/1991 | Botez et al. | 372/45 |
| 5,661,076 | 8/1997 | Yoo et al. | 438/39 |

OTHER PUBLICATIONS

Mayer et al, Electronic Materials Science: For Integrated Circuits in SI and GAAS, New York: Macmillan Publishing Company, p. inside back cover. (no month available), 1990.

*Primary Examiner*—James W. Davie
*Attorney, Agent, or Firm*—Eugene A. Parsons; William E. Koch

[57] ABSTRACT

A VCSEL for high power single mode operation and method of fabrication including a substrate element, a first stack of distributed Bragg reflectors disposed on a surface of the substrate element, an active region lattice matched to a surface of the first stack of distributed Bragg reflectors, and a second stack of distributed Bragg reflectors lattice matched to a surface of the active region. The VCSEL structure includes an isolation layer formed on the second stack of distributed Bragg reflectors. The isolation layer is formed of a dielectric material or insulating semiconductor material having an index of refraction greater than the first and second stacks of distributed Bragg reflectors and thereby defining an anti-guiding VCSEL structure. An electrical contact is coupled to a surface of the second stack of distributed Bragg reflectors and an electrical contact is positioned a surface of the substrate element.

8 Claims, 1 Drawing Sheet

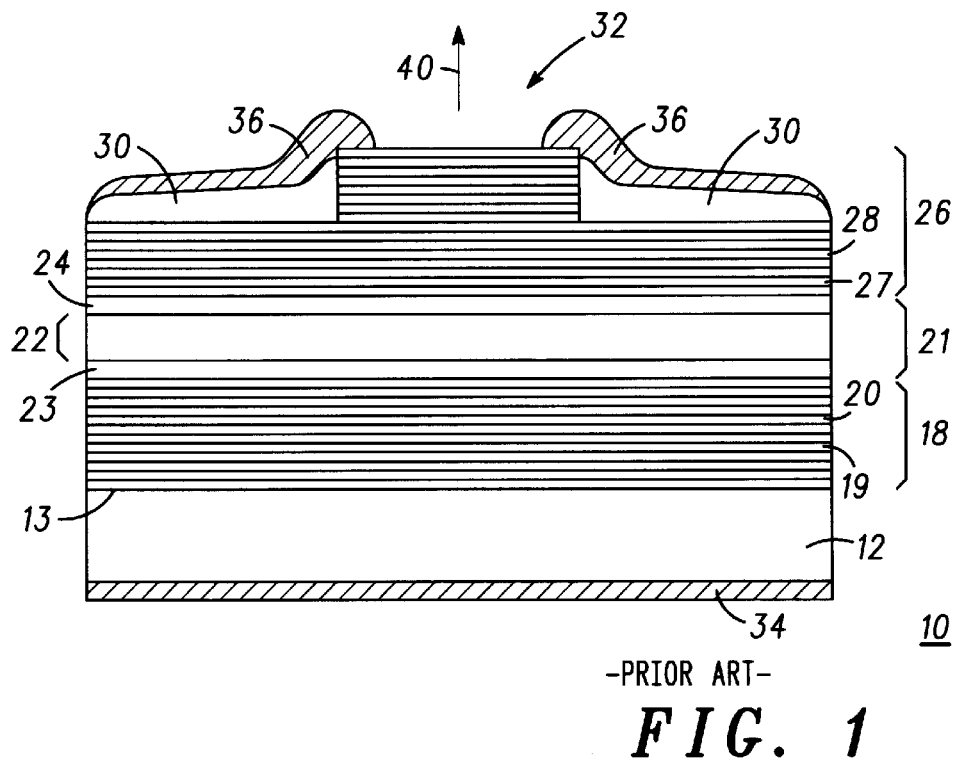
FIG. 1 —PRIOR ART—
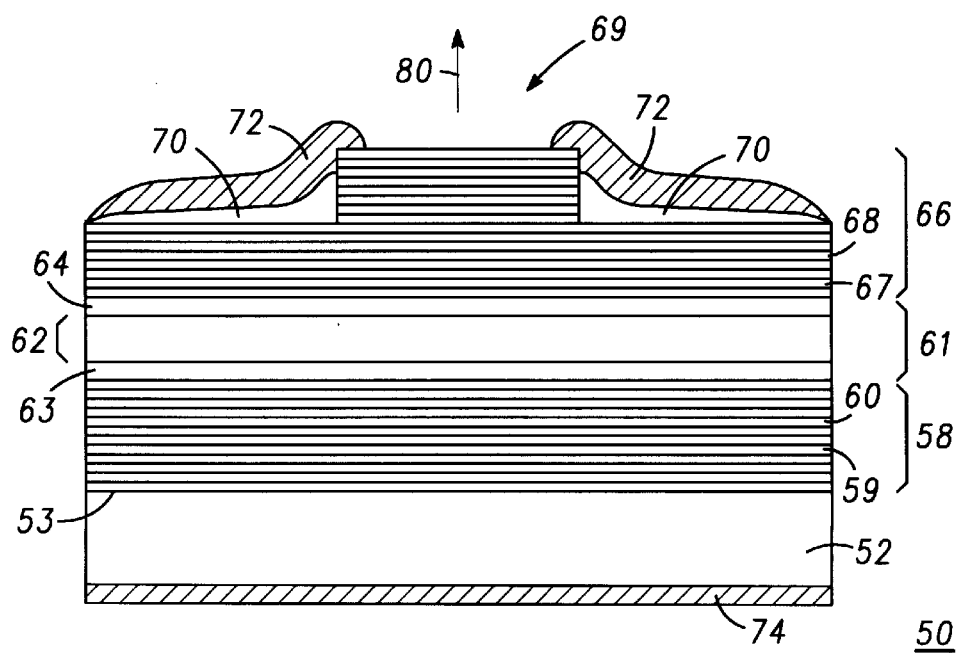
FIG. 2

VERTICAL CAVITY SURFACE EMITTING LASER FOR HIGH POWER SINGLE MODE OPERATION AND METHOD OF FABRICATION

FIELD OF THE INVENTION

This invention relates to vertical cavity surface emitting lasers and more specifically to vertical cavity surface emitting lasers for high power single mode operation.

BACKGROUND OF THE INVENTION

Vertical cavity surface emitting lasers (VCSEL) include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL is driven by current forced through the active region, typically achieved by providing a first contact on the reverse side of the substrate and a second contact on top of the second mirror stack.

The use of mirror stacks in VCSELs is well established in the art. Typically, mirror stacks are formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses an $Al_{x1}Ga_{1-x1}As\backslash Al_{x2}Ga_{1-x2}As$ material system wherein the different refractive index of each layer of a pair is achieved by altering the aluminum content x1 and x2 in the layers, more particularly the aluminum content x1 ranges from 0% to 50% and the aluminum content of x2 ranges from 50% to 100%. In conventional devices, the number of mirror pairs per stack may range from 20–40 pairs to achieve a high percentage of reflectivity, depending on the difference between the refractive indices of the layers. The large number of pairs increases the percentage of reflected light.

In conventional VCSELs, conventional material systems perform adequately. However, new products are being developed, such as CD write devices and those utilizing infrared data links, that require VCSELs to operate in a high power single mode. In general, VCSELs typically operate in a multimode due to carrier spatial hole burning and ring p-side metal contact induced current crowding effect. To achieve single mode operation in an index guided VCSEL, the active area must be reduced. Typically, to achieve single mode operation the active area is reduced to a diameter of less than 5 mm. With this reduction in active area it becomes difficult to achieve output power of greater than 2 milliwatts. To achieve higher power, generally the active area must be increased.

Thus, there is a need for developing a reliable, stable and cost effective vertical cavity surface emitting laser (VCSEL) for use in high power single mode operations, that operates at a high output power, while maintaining single spatial mode operation.

It would be highly advantageous, therefore, to remedy the foregoing and other deficiencies inherent in the prior art. Accordingly, it is an object of the present invention to provide a new and improved VCSEL for use in high power single mode operations.

Another object of the invention is to provide a reliable high power single mode VCSEL.

Another object of the immediate invention is to provide for an anti-guiding VCSEL structure for high power single mode operation.

Still another object of the invention is to provide for a high power single mode VCSEL having a power output in excess of 2 milliwatts.

Yet another object of the invention is to provide for a highly manufacturable high power single mode VCSEL.

SUMMARY OF THE INVENTION

Briefly, to achieve the desired objects of the instant invention in accordance with a preferred embodiment thereof, provided is a VCSEL for use in high power single mode operation. The VCSEL generally includes a substrate, a first stack of distributed Bragg reflectors, an active region, and a second stack of distributed Bragg reflectors. In a preferred embodiment, there is provided an isolation layer including one of amorphous silicon, polysilicon, semi-insulating gallium arsenide, amorphous gallium arsenide, or some similar dielectric material having a high index of refraction. This isolation layer provides for an anti-guiding VCSEL structure capable of generating higher single mode output power.

In addition, included is a method of fabricating a high power single mode VCSEL including the steps of providing a first wafer structure including a substrate having a surface, a first stack of distributed Bragg reflectors disposed on a surface of the substrate, an active region disposed on the surface of the first stack of distributed Bragg reflectors, and a second stack of distributed Bragg reflectors disposed on the surface of the active region. Next, provided is an isolation layer including at least one of amorphous silicon, polysilicon, semi-insulation gallium arsenide, amorphous gallium arsenide, or some similar dielectric material having a high index of refraction. Finally, a first and a second electrical contact are formed in electrical cooperation with the active region.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which:

FIG. 1 is a sectional view of a prior art VCSEL structure; and

FIG. 2 is a sectional view of a high power single mode anti-guiding VCSEL structure in accordance with the present invention.

DETAILED DESCRIPTION OF THE DRAWINGS

Turning now to the drawings in which like reference characters indicate corresponding elements throughout the several views, attention is first directed to FIG. 1 which illustrates the fabrication of a prior art vertical cavity surface emitting laser (VCSEL) wafer structure, or VCSEL device, generally designated 10. Wafer structure, or device, 10 in this particular embodiment is formed as a mesa, or ridge-like, structure. Wafer structure 10 is formed on a substrate 12, which in this specific embodiment is gallium arsenide (GaAs). GaAs is preferably used to facilitate lattice matching of the components of wafer structure 10 which in this particular embodiment emits infrared wavelength light, more particularly light in a range of 780 nm to 850 nm, dependent upon the specific material system used. A GaAs substrate is utilized so as to facilitate epitaxial growth of subsequent multiple layers that compose wafer structure 10. It should be understood that GaAs is only utilized as an example and other semiconductor materials may be employed as substrate 12, such as silicon (Si), indium phosphide (InP), or the like. Additionally, dependent upon material system, any wavelength emission is achievable by the structure disclosed in the present invention.

Typically, any suitable epitaxial deposition method, such as molecular beam epitaxy (MBE), metal organic chemical vapor deposition (MOCVD), or the like is used to make the required multiple layers for wafer structure 10. These methods allow for the epitaxial deposition of material layers, such as aluminum gallium arsenide, aluminum arsenide, indium aluminum gallium phosphide, gallium arsenide, and aluminum arsenide, or aluminum gallium phosphide, indium aluminum phosphide, and the like. It should be understood that epitaxial deposition is used extensively to produce the multitude of layers that comprise the complete VCSEL device of the present invention.

Substrate 12 has an upper surface 13 on which a first mirror stack 18 is disposed. An active region 21 is disposed on mirror stack 18. Active region 21 includes an active structure 22 sandwiched between a first cladding region 23 adjacent first mirror stack 18 and a second cladding region 24. A second mirror stack 26 is disposed on second cladding region 24.

Referring now to distributed Bragg reflectors 18 and 26, distributed Bragg reflector 18 is deposited first with subsequent deposition defining cladding region 23, active structure 22, cladding region 24, and distributed Bragg reflector 26. Distributed Bragg reflectors 18 and 26 are each composed of a plurality of layers, 19, 20, 27 and 28, respectively. Generally, thicknesses of alternating layers 19, 20, 27, and 28 are typically set as portions of a wavelength of light (not shown) that the complete VCSEL device is designed to emit. Thus, specific thicknesses of the alternating layers 19, 20, 27 and 28 are a function of the designed wavelength at which the VCSEL is to operate. Typically, the most common wavelength values used are one-quarter, one-half, three-quarters, full wavelength, or any multiples thereof. In a preferred embodiment of the present invention, one-quarter wavelength thicknesses are used.

Generally, doping of the distributed Bragg reflectors 18 and 26 is split with one of the distributed Bragg reflectors being N-type and the other being P-type. Since doping levels are well known in the art, the doping levels will not be described herein other than to identify material either as undoped, P-typed doped such as with carbon, zinc or the like, or N-typed doped such as with selenium, silicon, or the like. Briefly, distributed Bragg reflector 18 and a portion of cladding region 23 are N-type doped, with a portion of cladding region 23, active structure 22, and a portion of cladding region 24 being undoped, and with a portion of cladding region 24, and distributed Bragg reflector 26 being P-type doped.

In this prior art example, distributed Bragg reflectors 18 and 26 having alternating layers 19, 20, 27 and 28 are made of any suitable materials, such as aluminum gallium arsenide (AlGaAs) with the aluminum percentage ranging from 0 to 100% or materials forming a mirror stack. For example, a GaAs based VCSEL typically uses an $Al_{x1}Ga_{1-x1}As\backslash Al_{x2}Ga_{1-x2}As$ material system wherein the different refractive index of each layer of a pair is achieved by altering the aluminum content x1 and x2 in the layers, more particularly the aluminum content x1 ranges from 0% to 50% and the aluminum content of x2 ranges from 50% to 100%. The number of mirror pairs per stack may range from 20–40 pairs to achieve a high percentage of reflectivity, depending on the difference between the refractive indices of the layers. In the embodiments disclosed in the present invention it is anticipated that the second stack of distributed Bragg reflectors can alternatively include a plurality of pairs of alternating layers of a dielectric material to be deposited as a final step in the device fabrication process.

More specifically, a VCSEL structure designed to emit at 780 nm will include alternating layers 19, 20, 27, and 28 of $Al_{0.25}Ga_{0.75}As/Al_{0.95}Ga_{0.05}As$ or $Al_{0.25}Ga_{0.75}As/AlAs$. A VCSEL structure designed to emit at 850 nm will include alternating layers 19, 20, 27 and 28 of $Al_{0.15}Ga_{0.85}As/Al_{0.85}Ga_{0.15}As$. Irrespective of the material system utilized, layers 19 and 20 are epitaxially disposed or deposited on or overlaying substrate 12 and layers 27 and 28 are epitaxially disposed or deposited on or overlaying cladding region 24, thereby generating distributed Bragg reflectors 18 and 26. It should be understood that while AlGaAs/AlAs DBR structures are utilized in the preferred embodiment, alternative DBR structures utilizing materials such as indium aluminum gallium phosphide and aluminum arsenide (e.g., $In_{0.49}(Al_xGa_{1-x})_{0.51}P/AlAs$), and indium aluminum gallium phosphide and indium aluminum phosphide (e.g., $In_{0.49}(Al_xGa_{1-x})_{0.51}P/In_{0.49}Al_{0.5}P$) are anticipated by this disclosure for the device to operate at red visible emission wavelength (635–700 nm) in association with an appropriate active medium. Additionally, it should be understood that in each of the above examples and throughout this disclosure where a percent composition of a particular element is given it should be considered only as an example. It should be further understood that variations from these examples can be large and are to be considered part of the present invention.

Mirror stack 18 and 26 are formed by depositing pairs of alternating layers using some convenient technique such as molecular beam epitaxy (MBE) or sputtering. In order to crystal lattice match mirror stack 18 to substrate 12 a suitable semiconductor material system must be deposited. Approximately 20–40 mirror pairs of this material system are deposited on substrate 12 depending on the difference between the refractive indices of the layers. As will be explained presently, substrate doping is not necessary since electrical contacts to the active region can be made laterally to doped mirror stack 18.

For the sake of simplicity and to prevent overcrowding of the figure, cladding region 23 is shown as a single layer; however, it should be understood that cladding region 23 is made of at least two components that are epitaxially disposed or deposited on distributed Bragg reflector 18. First, a layer of any suitable material such as aluminum gallium arsenide (AlGaAs) having an appropriate thickness and being doped similarly to distributed Bragg reflector 18 is epitaxially deposited on distributed Bragg reflector 18.

By way of example, a N-doped aluminum gallium arsenide layer ($Al_{0.60}Ga_{0.40}As$) is epitaxially deposited on distributed Bragg reflector 18. Generally, the AlGaAs layer has a thickness that is determined by the wavelength of light that is to be emitted from the VCSEL structure, thereby allowing the thickness of the AlGaAs layer to be any suitable thickness. Second, a layer of any suitable material such as aluminum gallium arsenide (AlGaAs) having an appropriate thickness is epitaxially deposited on the first layer of the cladding region 23.

For the sake of simplicity, active structure 22 is represented by a single layer which is epitaxially deposited or disposed on cladding region 23; however, it should be understood that the active structure 22 can include multiple layers of barrier regions with quantum well regions interspersed. By way of a simple example, active structure 22 is made of at least two barrier layers and a quantum well region with the quantum well region being positioned between the barrier regions. In a preferred embodiment, active structure 22 is made of four barrier regions and three quantum well regions with the quantum well region being positioned between the two barrier regions. In a VCSEL structure that emits at 780 nm, the quantum well region(s) is made of undoped aluminum gallium arsenide ($Al_{0.12}Ga_{0.88}As$) and the barrier regions are made of aluminum gallium arsenide ($Al_{0.30}Ga_{0.70}As$). In a VCSEL structure that emits at 850 nm, the quantum well region(s) is made of undoped gallium arsenide (GaAs) and the barrier regions are made of aluminum gallium arsenide ($Al_{0.30}Ga_{0.70}As$). Typically, active structure 22 includes three to five quantum wells with their corresponding barrier regions. One skilled in the art will understand that more or fewer quantum well layers and barrier layers can be used depending upon the application. Active region 21 and first and second mirror stacks 18 and 26 respectively are configured to emit light with a wavelength of approximately 780 nm or 850 nm.

For the sake of simplicity and to prevent overcrowding of the figure, cladding region 24 is shown as a single layer; however, it should be understood that cladding region 24 is made of two components that are disposed or deposited epitaxially on active structure 22. First, a layer of any suitable undoped cladding material is epitaxially deposited to an appropriate thickness on active structure 22. Second, a layer of any suitable doped cladding material is epitaxially deposed on the undoped cladding material.

By way of example, an undoped aluminum gallium arsenide ($Al_{0.30}Ga_{0.70}As$) layer is epitaxially deposited on active structure 22. Generally, the undoped AlGaAs has a thickness that is determined by the wavelength of light that is to be emitted from the VCSEL device, thereby allowing the thickness of the AlGaAs layer to be any suitable thickness. Subsequently, a doped aluminum gallium arsenide ($Al_{0.60}Ga_{0.40}As$) layer is epitaxially deposited on the undoped layer. The doped layer is generally doped with a P-type dopant.

Second stack 26 of distributed Bragg reflectors is next etched to define a mesa structure 32. In this prior art example, an isolation layer 30 is deposited on an uppermost portion of second stack 26 of distributed Bragg reflectors. Isolation layer 26 is generally composed of silicon nitride (SiN) and has an index of refraction of approximately 2, which is less than first and second stacks 18 and 26 of distributed Bragg reflectors, thereby reflecting and guiding light impinging thereon, so as to define an index guided VCSEL structure. VCSEL 10 is characterized as index guided in that VCSEL 10 operates to emit multimode light that is guided by isolation layer 30 and first and second stacks 18 and 26 of distributed Bragg reflectors.

To complete wafer structure, or device, 10 an electrical contact 34 is coupled to a surface of substrate 12. A second electrical contact 36 is coupled to distributed Bragg reflector 26. Light 40 is emitted from device 10 in a direction opposite substrate 12. Various changes and modifications to the embodiments herein chosen for purposes of illustration will readily occur to those skilled in the art. For example, it should be understood that VCSEL structure symmetry exists for both the p and n dopants as well as electrically inverted structure designs.

Referring now to FIG. 2, a VCSEL structure, or device, 50 for high power single mode operation is disclosed. VCSEL structure, or device, 50 is generally similar to the prior art wafer structure, or device, 10 previously disclosed, except in this particular embodiment, device 50 is defined as a anti-guiding VCSEL structure. VCSEL 50 is formed on a substrate 52, which in this specific embodiment is gallium arsenide (GaAs). GaAs is preferably used to facilitate lattice matching of the components of VCSEL 50 which in this particular embodiment emits infrared wavelength light, more particularly 780 nm or 850 nm light, dependent upon the specific material system used. Also, GaAs is utilized so as to facilitate epitaxial growth of subsequent multiple layers that compose VCSEL 50. It should be understood that GaAs is only utilized as an example and other semiconductor materials may be employed as substrate 52, such as silicon (Si), indium phosphide (InP), or the like.

Typically, any suitable epitaxial deposition method, such as molecular beam epitaxy (MBE), metal organic chemical vapor deposition (MOCVD), or the like is used to make the required multiple layers for VCSEL 50. These methods allow for the epitaxial deposition of material layers, such as aluminum gallium arsenide, aluminum arsenide, indium aluminum gallium phosphide, gallium arsenide, and aluminum arsenide, or aluminum gallium phosphide, indium aluminum phosphide, and the like. It should be understood that epitaxial deposition is used extensively to produce the multitude of layers that comprise the complete VCSEL device of the present invention.

Substrate 52 has an upper surface 53 on which a first mirror stack 58 is disposed. An active region 61 is disposed on mirror stack 58. Active region 61 includes an active structure 62 sandwiched between a first cladding region 63 adjacent first mirror stack 58 and a second cladding region 64. A second mirror stack 66 is disposed on second cladding region 64.

Referring now to distributed Bragg reflectors 58 and 66, it should be understood that distributed Bragg reflector 58 is deposited first with subsequent deposition defining cladding region 63, active structure 62, cladding region 64, and distributed Bragg reflector 66. Distributed Bragg reflectors 58 and 66 are each composed of a plurality of layers, 59, 60, 67 and 68, respectively. Generally, thicknesses of alternating layers 59, 60, 67, and 68 are typically set as portions of a wavelength of light (not shown) that the complete VCSEL device is designed to emit. Thus, specific thicknesses of the alternating layers 59, 60, 67 and 68 are a function of the designed wavelength at which the VCSEL is to operate. Typically, the most common wavelength values used are one-quarter, one-half, three-quarters, full wavelength, or any multiples thereof. In a preferred embodiment of the present invention, one-quarter wavelength thicknesses are used.

Generally, doping of the distributed Bragg reflectors 58 and 66 is split with one of the distributed Bragg reflectors being N-type and the other being P-type. Since doping levels are well known in the art, the doping levels will not be described herein other than to identify material either as undoped, P-typed doped such as with carbon, zinc or the like, or N-typed doped such as with selenium, silicon, or the like. Briefly, distributed Bragg reflector 58 and a portion of cladding region 63 are N-type doped, with a portion of cladding region 63, active structure 62, and a portion of cladding region 64 being undoped, and with a portion of cladding region 64, and distributed Bragg reflector 66 being P-type doped.

In the present invention, distributed Bragg reflectors 58 and 66 having alternating layers 59 and 60, 67 and 68 are made of any suitable materials, such as aluminum gallium arsenide (AlGaAs) with the aluminum percentage ranging from 0 to 100% or materials forming a dielectric mirror stack. More specifically, a VCSEL structure designed to emit at 780 nm will include alternating layers 59, 60, 67, and 68 of $Al_{0.25}Ga_{0.75}As/Al_{0.95}Ga_{0.05}As$ or $Al_{0.25}Ga_{0.75}As/AlAs$. A VCSEL structure designed to emit at 850 nm will include alternating layers 59, 60, 67 and 68 of $Al_{0.15}Ga_{0.85}As/Al_{0.85}Ga_{0.15}As$. Irrespective of the material system utilized, layers 59 and 60 are epitaxially disposed or deposited on or overlaying substrate 52 and layers 67 and 68 are epitaxially disposed or deposited on or overlaying cladding region 64, thereby generating distributed Bragg reflectors 58 and 66. It should be understood that while AlGaAs/AlAs DBR structures are utilized in this particular embodiment, alternative DBR structures utilizing materials such as indium aluminum gallium phosphide and aluminum arsenide (e.g., $In_{0.49}(Al_xGa_{1-x})_{0.51}P/AlAs$), and indium aluminum gallium phosphide and indium aluminum phosphide (e.g., $In_{0.49}(Al_xGa_{1-x})_{0.51}P/In_{0.49}Al_{0.5}P$) are anticipated by this disclosure. Additionally, it should be understood that in each of the above examples and throughout this disclosure where a percent composition of a particular element is given it should be considered only as an example. It should be further understood that variations from these examples can be large and are to be considered part of the present invention.

Mirror stack 58 and 66 are formed by depositing pairs of alternating layers using some convenient technique such as molecular beam epitaxy (MBE) or sputtering. In order to crystal lattice match mirror stack 58 to substrate 52 a suitable semiconductor material system must be deposited. Approximately 20–40 mirror pairs of this material system are deposited on substrate 52 depending on the difference between the refractive indices of the layers. As will be explained presently, substrate doping is not necessary since electrical contacts to the active region can be made laterally to the n-doped DBR mirror stack.

For the sake of simplicity and to prevent overcrowding of the figure, cladding region 63 is shown as a single layer; however, it should be understood that cladding region 63 is made of at least two components that are epitaxially disposed or deposited on distributed Bragg reflector 58. First, a layer of any suitable material such as aluminum gallium arsenide (AlGaAs) having an appropriate thickness and being doped similarly to distributed Bragg reflector 58 is epitaxially deposited on distributed Bragg reflector 58.

By way of example, a N-doped aluminum gallium arsenide layer ($Al_{0.60}Ga_{0.40}As$) is epitaxially deposited on distributed Bragg reflector 58. Generally, the AlGaAs layer has a thickness that is determined by the wavelength of light that is to be emitted from the VCSEL structure, thereby allowing the thickness of the AlGaAs layer to be any suitable thickness. Second, a layer of any suitable material having an appropriate thickness is epitaxially deposited on the first layer of the cladding region 63.

For the sake of simplicity, active structure 62 is represented by a single layer which is epitaxially deposited or disposed on cladding region 23; however, it should be understood that the active structure 62 can include multiple layers of barrier regions with quantum well regions interspersed. By way of a simple example, active structure 62 is made of at least two barrier layers and a quantum well region with the quantum well region being positioned between the two barrier regions. In a preferred embodiment, active structure 62 is made of four barrier regions and three quantum well regions with the quantum well region being positioned between the two barrier regions. In a VCSEL structure that emits at 780 nm, the quantum well region(s) is made of undoped aluminum gallium arsenide ($Al_{0.12}Ga_{0.88}As$) and the barrier regions are made of aluminum gallium arsenide ($Al_{0.30}Ga_{0.70}As$). In a VCSEL structure that emits at 850 nm, the quantum well region(s) is made of undoped gallium arsenide (GaAs) and the barrier regions are made of aluminum gallium arsenide ($Al_{0.30}Ga_{0.70}As$). Typically, active structure 62 includes three to five quantum wells with their corresponding barrier regions. One skilled in the art will understand that more or fewer quantum well layers and barrier layers can be used depending upon the application. Active region 61 and first and second mirror stacks 58 and 66 respectively are configured to emit light with a wavelength of approximately 780 nm or 850 nm.

For the sake of simplicity and to prevent overcrowding of the figure, cladding region 64 is shown as a single layer; however, it should be understood that cladding region 64 is made of two components that are disposed or deposited epitaxially on active structure 62. First, a layer of any suitable undoped cladding material is epitaxially deposited to an appropriate thickness on active structure 62. Second, a layer of any suitable doped cladding material is epitaxially deposed on the undoped cladding material.

By way of example, an undoped aluminum gallium arsenide ($Al_{0.30}Ga_{0.60}As$) layer is epitaxially deposited on active structure 62. Generally, the undoped AlGaAs has a thickness that is determined by the wavelength of light that is to be emitted from the VCSEL device, thereby allowing the thickness of the AlGaAs layer to be any suitable thickness. Subsequently, a doped aluminum gallium arsenide ($Al_{0.60}Ga_{0.40}As$) layer is epitaxially deposited on the undoped layer. The doped layer is generally doped with a P-type dopant.

Next, the device, or wafer structure, 50 is selectively etched to define a ridge wave guide, or mesa, structure 69 to define the current flow within the device. An isolation, or protection, layer 70 of a dielectric material or an insulating semiconductor material, such as amorphous silicon, polysilicon, semi-insulating gallium arsenide (GaAs), amorphous gallium arsenide, or some other similar material characterized as having a high refractive index is deposited on the sides defining mesa structure 69. With a greater index of refraction in isolation layer 70 than the average index of refraction of first and second stacks 58 and 61 of distributed Bragg reflectors, an anti-guiding VCSEL structure, characterized as generating higher single mode output power, is achieved. During operation loss of higher order modes is supported with this anti-guiding VCSEL structure.

To complete wafer structure, or device, 50 an electrical contact 72 is deposited on isolation layer 70 and coupled to distributed Bragg reflector 66. A second electrical contact 74 is coupled to a surface of substrate 52. Light 80 is emitted from device 50 in a direction opposite substrate 52. Due to the use of an isolation layer exhibiting highly refractive index properties so as to define an anti-guided VCSEL structure (previously described), high power single mode operation is now achievable. Various changes and modifications to the embodiments herein chosen for purposes of illustration will readily occur to those skilled in the art. For example, it should be understood that VCSEL structure symmetry exists for both the p and n dopants as well as electrically inverted structure designs.

The various steps of the method disclosed have been performed in a specific order for purposes of explanation, however, it should be understood that various steps of the disclosed method may be interchanged and/or combined with other steps in specific applications and it is fully intended that all such changes in the disclosed methods come within the scope of the claims.

While we have shown and described specific embodiments of the present invention, further modifications and improvement will occur to those skilled in the art. We desire it to be understood, therefore, that this invention is not limited to the particular forms shown and we intend in the appended claims to cover all modifications that do not depart from the spirit and scope of this invention.

What is claimed is:

1. A vertical cavity surface emitting laser device comprising:

a substrate having a surface;

a first stack of distributed Bragg reflectors disposed on the surface of the substrate;

an active region disposed on the first stack of distributed Bragg reflectors;

a second stack of distributed Bragg reflectors disposed on the active region; and an isolation layer disposed on the second stack of distributed Bragg reflectors, the isolation layer including one of amorphous silicon or polysilicon and having an index of refraction greater than an index of refraction of the first and second stacks of distributed Bragg reflectors.

2. A vertical cavity surface emitting laser device as claimed in claim 1 wherein the laser is configured for high power single mode operation of greater than 2 milliwatts.

3. A vertical cavity surface emitting laser device as claimed in claim 2 wherein the laser is defined by a ridge wave guide wafer structure.

4. A vertical cavity surface emitting laser device as claimed in claim 2 wherein the isolation layer, the first and second stacks of distributed Bragg reflectors and the active region are characterized as defining an anti-guiding VCSEL structure wherein higher order modes experience a higher loss during operation.

5. A vertical cavity surface emitting laser device comprising:

a substrate having a surface;

a first stack of distributed Bragg reflectors including a plurality of pairs of alternating layers disposed on the surface of the substrate, the first stack of distributed Bragg reflectors having a surface;

an active region having a first and a second surface and including an active structure sandwiched between a first cladding region and a second cladding region, the active region being lattice matched to the surface of the first stack of distributed Bragg reflectors;

a second stack of distributed Bragg reflectors lattice matched to the second surface of the active region and including a plurality of pairs of alternating layers; and an isolation layer including one of amorphous silicon or polysilicon, the isolation layer having an index of refraction greater than an index of refraction of the first and second stacks of distributed Bragg reflectors.

6. A vertical cavity surface emitting laser device as claimed in claim 5 wherein the laser is configured for high power single mode operation of greater than 2 milliwatts.

7. A vertical cavity surface emitting laser device as claimed in claim 6 wherein the laser is defined by a ridge wave guide wafer structure.

8. A vertical cavity surface emitting laser device as claimed in claim 7 wherein the isolation layer, the first and second stacks of distributed Bragg reflectors and the active region are characterized as defining an anti-guiding VCSEL structure wherein higher order modes experience higher loss during operation.

* * * * *